(12) United States Patent
Tabatabaei et al.

(10) Patent No.: US 7,239,969 B2
(45) Date of Patent: Jul. 3, 2007

(54) SYSTEM AND METHOD OF GENERATING TEST SIGNALS WITH INJECTED DATA-DEPENDENT JITTER (DDJ)

(75) Inventors: Sassan Tabatabaei, Sunnyvale, CA (US); Michael Lee, Sunnyvale, CA (US); Mordechai Ben-Zeev, San Jose, CA (US)

(73) Assignee: Guide Technology, Inc., Sunnyvale, CA (US)

( * ) Notice: Subject to any disclaimer, the term of this patent is extended or adjusted under 35 U.S.C. 154(b) by 178 days.

(21) Appl. No.: 10/984,547

(22) Filed: Nov. 9, 2004

(65) Prior Publication Data

US 2006/0100801 A1    May 11, 2006

(51) Int. Cl.
*G01R 29/26* (2006.01)
(52) U.S. Cl. ............................................. 702/69; 702/79
(58) Field of Classification Search ................. 702/69, 702/78, 79, 124, 125, 126
See application file for complete search history.

(56) References Cited

U.S. PATENT DOCUMENTS

| | | | |
|---|---|---|---|
| 4,757,452 A | 7/1988 | Scott et al. | |
| 4,908,784 A | 3/1990 | Box et al. | |
| 6,091,671 A | 7/2000 | Kattan | |
| 6,194,925 B1 | 2/2001 | Kimsal | |
| 6,298,315 B1 | 10/2001 | Li et al. | |
| 6,356,850 B1 | 3/2002 | Wilstrup et al. | |
| 6,665,808 B1 | 12/2003 | Schinzel | |
| 6,701,269 B1 * | 3/2004 | Jungerman et al. | ......... 702/106 |
| 7,003,180 B2 * | 2/2006 | Richardson et al. | ........... 385/1 |
| 2002/0174159 A1 | 11/2002 | Laquai | |
| 2003/0041294 A1 | 2/2003 | Moll et al. | |
| 2003/0223376 A1 | 12/2003 | Elliott et al. | |
| 2003/0223487 A1 | 12/2003 | Fisher | |

(Continued)

OTHER PUBLICATIONS

Technical Document—*Jitter Separation-50 Mb/s To Over 40 Gb/s Using the Agilent 86100C Infiniium DCA-J*; pp. 1 through 27, Agilent Technologies, Inc., Dec. 2003.

(Continued)

*Primary Examiner*—Carol S. W. Tsai
*Assistant Examiner*—Anthony Gutierrez
(74) *Attorney, Agent, or Firm*—Dority & Manning, P.A.

(57) ABSTRACT

A system and related method for generating a test signal with controllable amounts of signal jitter includes a pattern generator, a programmable arbitrary waveform generator (AWG) and a phase modulator. The pattern generator is configured to generate a data signal characterized by a given data pattern, bit rate and pattern length. A trigger signal representative of initial timing information associated with the data signal is provided to the AWG which subsequently generates a modulation signal with a frequency equal to the bit rate divided by the pattern length of the data signal. This modulation signal is provided to the phase modulator, along with a reference clock signal, and the phase modulator generates a modulated clock signal controlled by a phase modulation means (e.g., a controllable delay line) fed by the modulation signal. The resultant jittery clock signal is then provided to the pattern generator to adjust the timing of the data signal and to generate a signal representative of a data signal with data-dependent jitter characteristics. Additional inputs to the delay line of the pulse generator may include a random Gaussian noise signal for providing random jitter and a periodic signal for providing periodic jitter.

18 Claims, 5 Drawing Sheets

U.S. PATENT DOCUMENTS

| | | |
|---|---|---|
| 2004/0143406 A1* | 7/2004 | Nishikobara et al. .......... 702/69 |
| 2004/0208129 A1 | 10/2004 | Old et al. |
| 2005/0044463 A1 | 2/2005 | Frisch |
| 2005/0075810 A1* | 4/2005 | Laquai ........................ 702/69 |
| 2005/0097420 A1 | 5/2005 | Frisch et al. |
| 2005/0152488 A1* | 7/2005 | Buckwalter et al. ........ 375/350 |
| 2005/0243960 A1* | 11/2005 | Jungerman .................. 375/371 |
| 2005/0286670 A1* | 12/2005 | Jungerman .................. 375/371 |
| 2006/0045175 A1* | 3/2006 | Draving et al. ............. 375/224 |

OTHER PUBLICATIONS

Technical Document—*Analyzing Jitter Using a Spectrum Approach*; pp. 1 through 8; Tektronix, Inc., 2002.

Technical Document—*Measuring Jitter in Digital Systems*; pp. 1-16, Agilent Technologies, Inc. Jun. 2003.

* cited by examiner

SYSTEM AND METHOD OF GENERATING TEST SIGNALS WITH INJECTED DATA-DEPENDENT JITTER (DDJ)

BACKGROUND OF THE INVENTION

In general, an integrated circuit (IC) refers to an electrical circuit contained on a single monolithic chip containing active and passive circuit elements. As should be well understood in this art, ICs are fabricated by diffusing and depositing successive layers of various materials in a preselected pattern on a substrate. The materials can include semiconductive materials such as silicon, conductive materials such as metals, and low dielectric materials such as silicon dioxide. The semiconductive materials contained in IC chips are used to form such conventional circuit elements as resistors, capacitors, diodes and transistors.

ICs are used in great quantities in electronic devices such as digital computers because of their small size, low power consumption and high reliability. The complexity of various ICs ranges from simple logic gates and memory units to large arrays capable of complete video, audio and print data processing. As the semiconductor industry strives to meet technological demands for faster and more efficient circuits, IC chips and assemblies are created with reduced dimensions, higher operating speeds and reduced energy requirements. As IC signal speeds increase, timing errors and pulse width deviations within such signals may constitute a greater portion of a signal period that the signal itself.

Timing fluctuations in integrated circuits are generally referred to as "jitter". Jitter can be broadly defined in certain interpretations as the variation of a signal edge from its ideal position in time, and can be an important performance measure for integrated circuit signals, including serial links and clock signals. For serial link qualification, jitter is decomposed into its various components, which may be divided into three types: random jitter (RJ), data-dependent jitter (DDJ) and periodic jitter (PJ). Each of these components is correlated with physical sources and impact bit error rate (BER) differently. Random jitter is typically due to device noise sources, e.g., thermal and flicker noise, and is assumed to be unbounded with Gaussian distribution. The combination of DDJ and PJ are bounded and can be traced back to deterministic sources such as transmission path bandwidth limitations and cross-coupling.

The continued demand for GHz processors and high-capacity communications system has resulted in an increasing number of low-cost high volume ICs clocked at GHz rates and beyond and/or equipped with multi-Gb/s serial interfaces. Circuits achieving such clock and/or data rates are characterized by very stringent timing specifications, often dictated by governing standards. Many of these standards specify maximum limits on jitter components for the transmitter (jitter generation) and minimum tolerable limits for the receiver (jitter tolerance). One major purpose of specifying limits on jitter components is to provide faster ways to estimate BER and to provide a better interoperability measure when the devices are used in a system environment.

Qualifying a transmitter requires measurement of transmitter jitter components, while receiver testing necessitates generation of data streams with controlled amounts of RJ, DDJ and PJ. As such, the need exists for features and steps to both generate jitter for receiver testing and to measure jitter for transmitter testing.

SUMMARY OF THE INVENTION

The present subject matter provides a system and method for generation of signals with controlled timing variations (i.e., signal jitter). One type of signal jitter that is injected into such test signals in accordance with embodiments of the present invention is data-dependent signal jitter. Other types that may be incorporated include periodic jitter and random jitter.

It is an object of the present subject matter to provide techniques for the signal injection of deterministic jitter in a controlled and programmable fashion. It is also desired in some embodiments of the present technology to provide steps and features for random jitter injection having programmable RMS values without causing a substantial amount of amplitude noise. Features for providing both large amplitude (multiple UI) low frequency and low amplitude high frequency periodic jitter injection may also be included in some exemplary embodiments.

It is another object of certain embodiments of the present invention to provide DDJ signal generation technology that eliminates a need for bulky and difficult-to-control DDJ injection filters. An example of a prior art system employing a DDJ injection filter is presented later. This may be done in some embodiments by replacing tunable filters with a programmable arbitrary waveform generator (AWG), which significantly enhances DDJ injection control and flexibility. Varied exemplary embodiments of a system and method for generating test signals with injected jitter are hereafter presented.

In one exemplary embodiment of the present invention, a system for generating a test signal with controllable amounts of signal jitter includes at least three signal generators. A first signal generator (e.g., a pattern generator) is configured to generate a data signal characterized by a given data pattern having a preselected bit rate and pattern length and that is periodically repeated at a first frequency. The first signal generator also generates a trigger signal having a known relationship with the data pattern that is then coupled to the second signal generator. The second signal generator (e.g., an arbitrary waveform generator (AWG)) generates a periodic modulation signal having a main harmonic frequency that is substantially equal to the bit rate of the data signal generated by the first signal generator divided by the pattern length of the data signal. The third signal generator (e.g., a phase modulator or a pulse generator with a controllable delay line input) receives the modulation signal from the second signal generator and generates a clock signal that is phase modulated based on the timing of the modulation signal. Such phase modulation may be effected by phase modulation means such as a controllable delay line within the pulse generator. The clock signal is then provided as an input to the first signal generator to adjust the timing of the data signal.

In more particular embodiments of the aforementioned signal generation system, a reference clock generator may be provided and coupled to selected of the signal generators to ensure synchronized operation among various elements of the system. Fourth and/or fifth signal generators may also be provided for generating signals for combining with the modulation signal generated by the second signal generator before such modulation signal is provided as input for the third signal generator. A fourth signal generator may correspond to a random Gaussian noise generator to simulate the effects of random jitter, and a fifth signal generator may provide a signal representative of periodic signal jitter.

Yet another embodiment of the presently disclosed technology concerns a method of generating a test signal with controllable amounts of signal jitter. Such a method includes steps of establishing a data pattern, bit rate and pattern length for a data signal. A modulation signal is then generated having a repetition frequency that is substantially equal to the bit rate divided by the pattern length established for the data signal. Subsequent steps correspond to modulating the phase of a clock signal by the modulation signal and generating a data signal with the data pattern and pattern length provided in the establishing step and with a bit rate defined by the modulated clock signal from the modulating step.

In other related embodiments, a trigger signal representative of selected data signal characteristics (e.g., bit rate, pattern length, frequency) may be provided to a signal generator that subsequently performs the generation of the modulation signal. Another step of ensuring the phase consistency of the generated modulation and data signals may also be implemented.

The accompanying drawings, which are incorporated in and constitute a part of this specification, illustrate one or more embodiments of the present subject matter, and together with the description serve to explain certain principles of the disclosed technology. Additional embodiments of the present subject matter may incorporate various steps or features of the above-referenced embodiments, and the scope of the presently disclosed technology should in no way be limited to any particular embodiment. Additional objects, features and aspects of the present subject matter and corresponding embodiments are discussed in greater detail below.

BRIEF DESCRIPTION OF THE DRAWINGS

A full and enabling disclosure of the present subject matter, including the best mode thereof, directed to one of ordinary skill in the art, is set forth in the specification, which makes reference to the appended drawings, in which.

Figure 1:
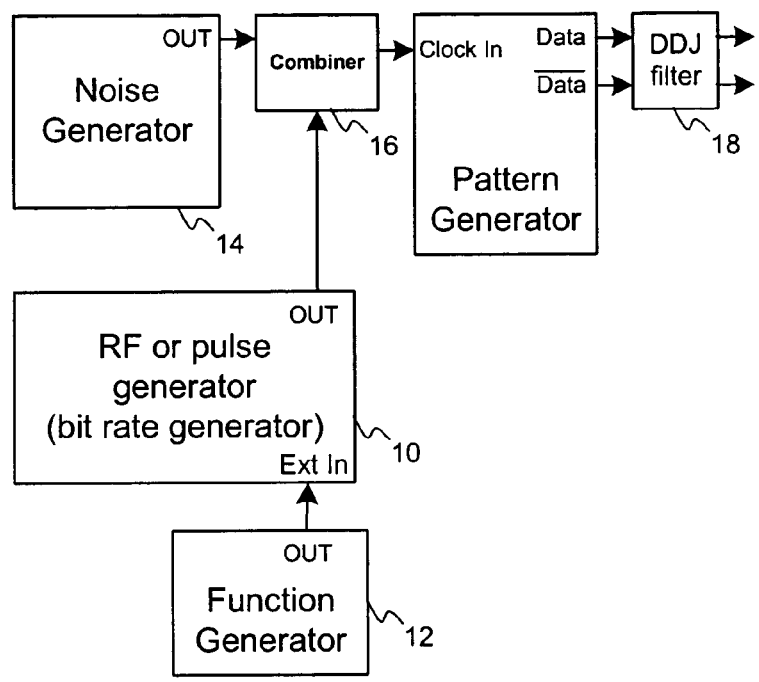
FIG. 1 provides a schematic diagram representation of exemplary hardware components of a known test setup used for generation of test signals with injected random, periodic, and data-dependent jitter.

Repeat use of reference characters in the present specification and drawings is intended to represent same or analogous features or elements of the present subject matter.

DETAILED DESCRIPTION OF EXEMPLARY EMBODIMENTS

Reference will now be made in detail to presently preferred embodiments of the disclosed technology, one or more examples of which are illustrated in the accompanying drawings. Each example is provided by way of explanation of the present technology, not limitation of the present technology. In fact, it will be apparent to those skilled in that art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

Referring now to the drawings, FIG. 1 shows a known exemplary test setup used for jitter injection in some prior art applications. An RF generator 10 coupled to a function generator 12 is used as a stable clock source. The output of a noise generator 14 is superimposed on the clock signal via combiner 16 to add random jitter. DDJ filter 18 is embodied by such exemplary components as a low-pass multiple-pole filter or a long cable, or other component that provides an effective source of DDJ. The FM or PM modulation capability of RF generator 10 acts as a sinusoidal jitter source. The exemplary setup of FIG. 1, although sufficient for some applications, lacks flexibility for use in multiple applications (requiring different bit rates and data patterns) because of several issues.

Figure 2:
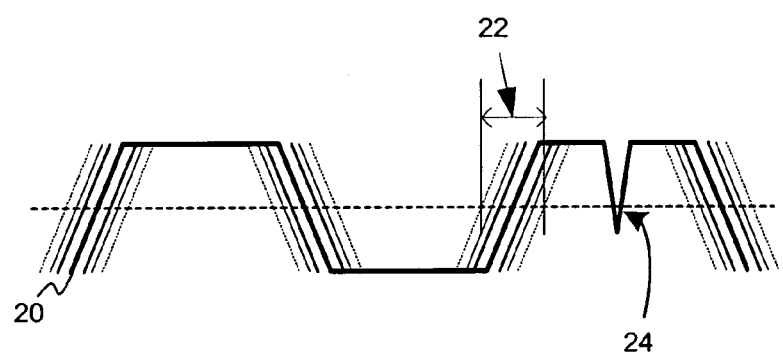
FIG. 2. provides a graphical illustration of an exemplary signal generated with the known test setup of FIG. 1, specifically depicting extra signal edges due to excessive amplitude noise.

A first reason that the exemplary test setup of FIG. 1 lacks flexibility for use in multiple applications relates to the observation that superimposition of random noise with an RF signal works well as a source of RJ only for small RJ injection (typically 0.02 UI) where UI corresponds to a unit interval or average bit rate for a given signal). As the noise level is increased to generate larger RJ, the possibility of encountering spurious edges that would cause false edges away from the bit transition increases due to amplitude noise. Even some known limiting amplifiers may not eliminate such sharp glitches. As shown in FIG. 2, when RJ is injected in signal 20 at location 22, false edges (such as edge 24) due to excessive noise amplitude violate phase modulation conditions, which affect jitter measurement accuracy with varying degrees depending on the measurement method used. In addition, the amount of injected jitter depends on the RF or pulse generator effective rise/fall time, which necessitates time-consuming calibration when testing different bit rates or test conditions.

A second limitation of the exemplary test setup of FIG. 1 results since the use of filters or long cables typically is limited to specific bit rates for a given amount of DDJ. Cables and filters have to be adjusted and calibrated for different bit rates specified for each I/O standard. Furthermore, most RF generators are capable of low to medium frequency FM or PM modulation (typically less than 10 MHz). However, in serial communication links, often the real PJ components that require testing are due to coupling clock sources in the range of 20 MHz to 400 MHz.

Due to the aforementioned limitations of the known exemplary test setup of FIG. 1, an improved system and method for providing jitter injection is presented in accordance with the subject invention. More particularly, exemplary jitter injection technology based on wide band phase modulation (e.g., controllable delay line) or direct timing synthesis is presented in accordance with embodiments of the present invention. Such technology provides RJ injection having programmable RMS values without causing amplitude noise. Such technology further provides a programmable amount of DDJ for any bit-rate and pattern. This technique employs programmable AWGs instead of tunable filters, thus significantly enhancing DDJ injection control and flexibility. Some exemplary embodiments of the present invention are capable of both large amplitude (multiple UI) low frequency and low amplitude high frequency PJ injection.

Figure 3:
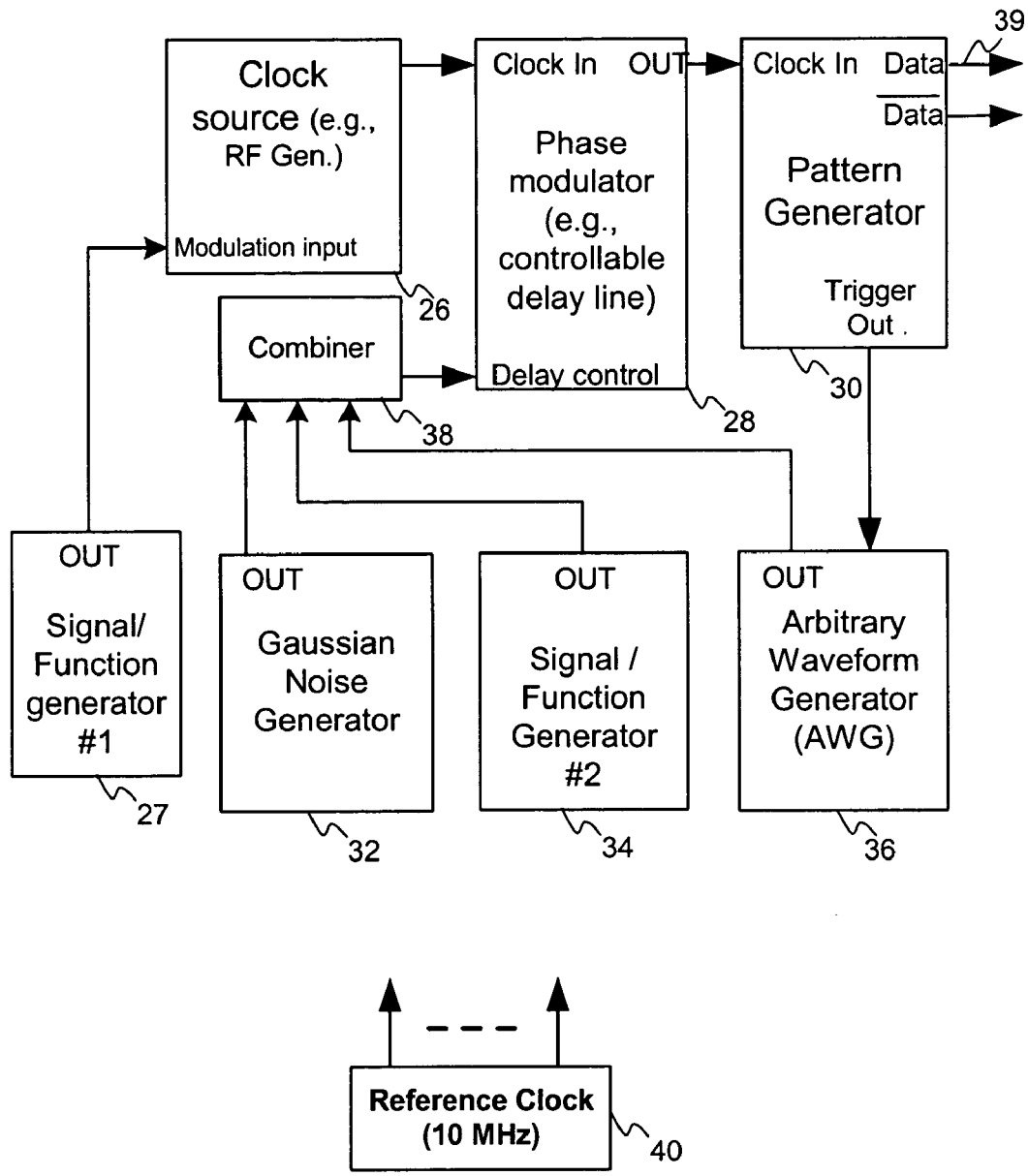
FIG. 3 provides a schematic diagram representation of exemplary hardware components of a test setup in accordance with one embodiment of the present invention, specifically utilized for generation of test signals with injected random, periodic, and data-dependent jitter.

Referring now to FIG. 3, an exemplary embodiment of a test setup for providing programmable jitter injection in accordance with the present invention is provided. A clock source 26, for example an RF generator, is used for low jitter bit clock generation. A first signal or function generator 27 is provided to modulate the clock source 26. Subsequently, a phase modulator 28 modulates the bit clock for jitter injection. An example of a phase modulator 28 corresponds to a controllable delay line within a pulse/pattern generator, such as an Agilent 81133 pattern generator. The resulting "jittery" clock signal output by phase modulator 28 drives a pattern generator 30 to provide a high-speed data signal with a repeating pattern and controlled jitter. An example of a pattern generator corresponds to an Advantest D3186 pattern generator. RJ is simulated by the output of a Gaussian noise generator 32, such as a NoiseCom PNG7109 noise generator. The output of noise generator 32 is Gaussian noise with 1 GHz bandwidth, which emulates high bandwidth Gaussian random jitter as is specified in many standards. Periodic jitter is simulated by the output of an additional signal/function generator 34, such as an Agilent 8648A device. Signal generator 34 acts as the PJ source, with capability to inject up to 500 ps peak-to-peak periodic jitter. Finally, DDJ is generated by an arbitrary waveform generator (AWG) 36, such as a Tektronix AWG610. Special calibration may be required if there is any delay between the pattern trigger signal and the first edge of the pattern, and/or if there is any non-linearity or bandwidth limitations in the phase modulator (e.g., delay line). Calibration may be performed by measuring injected DDJ with a DDJ measurement device (e.g., an oscilloscope or TIA/CTIA) on a per-edge basis and computing the difference relative to expected per-edge DDJ. This difference can be added to the pre-programmed level in the AWG 36.

The above jitter generation devices provide signals that are combined via combiner 38 before being provided to the delay control input of phase modulator 28 to inject jitter in the clock source. A reference clock 40, for example one configured for operation at 10 MHz or other predetermined frequency, may also be employed as a clock reference for selected other components in the exemplary test setup of FIG. 3.

The exemplary test setup illustrated in FIG. 3 provides two jitter injection mechanisms. The first is the PM and/or FM modulation capability of the clock source 26. This is primarily used to inject low frequency PJ with multiple unit interval (UI) variation(s) to test receiver tolerance to PJ up to a few MHz range. The second mechanism uses a delay line modulation approach, which effectively provides high bandwidth phase modulation. The exemplary phase modulator 28 includes such a delay control. The exemplary test setup of FIG. 3 employed with an Agilent 81133 pulse generator 28 can be used for a bit error rate test if peak-to-peak jitter at a BER=10-12 is less than 500 ps because the Agilent 81133 can accommodate only ±250 ps jitter modulation. For total jitter more than 500 ps, delay lines with a wider modulation range may need to be utilized.

Figure 4:
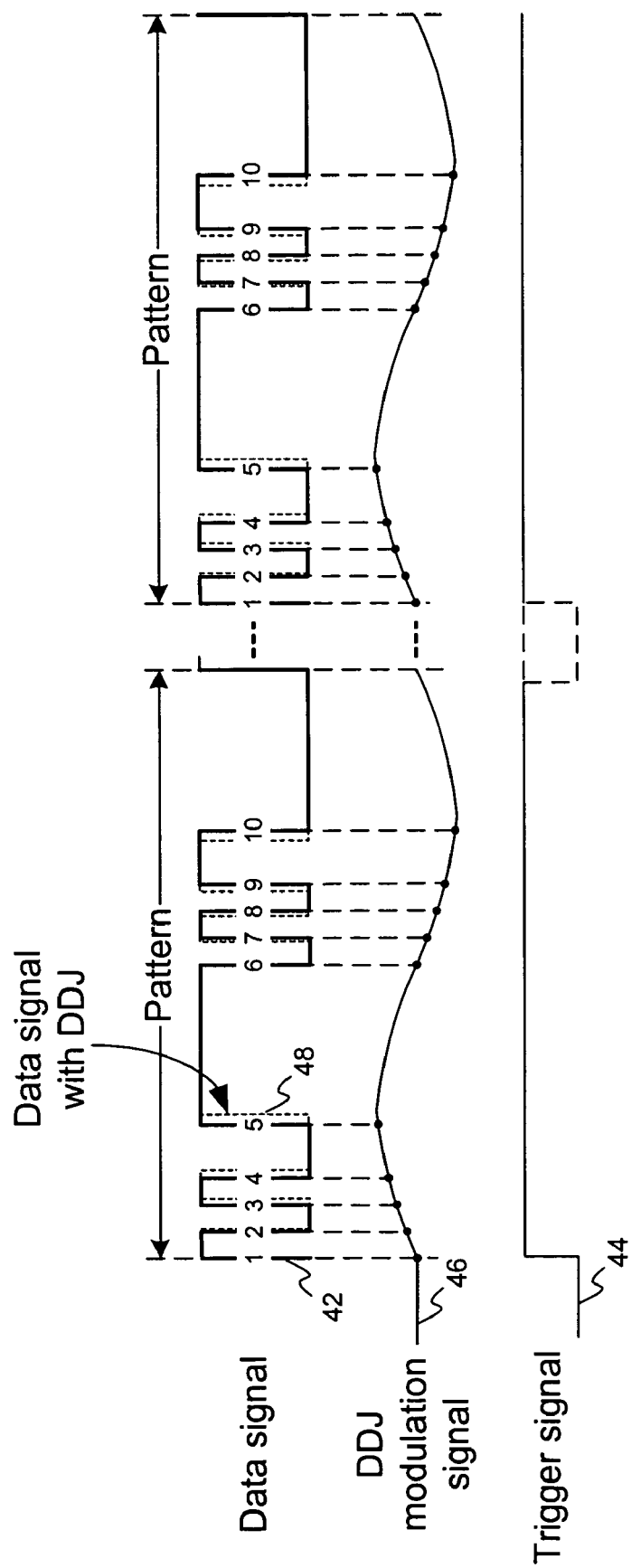
FIG. 4 provides a graphical illustration of exemplary signals depicting aspects of the DDJ injection technology employed in the test setup of FIG. 3.

A significant aspect of the test setup of FIG. 3 concerns the AWG 36, which is used as a DDJ source for data signals with a repeated pattern. In accordance with embodiments of the present invention, the output of AWG 36 is set such that its frequency is equal to the data bit rate of the signal generated by pattern generator 30 divided by the pattern length in bits. For example, referring now to FIG. 4, assume that the pattern generator 30 of FIG. 3 is configured to output a data signal 42 represented by the solid lines in the first waveform of FIG. 4. Data signal 42 consists of a given data pattern having ten rising and falling edges that is repeated at periodic intervals. It should be appreciated that a variety of data patterns and bit lengths may be utilized by pattern generator 30 in accordance with various embodiments of the present invention, and the specific values may be programmed and changed as desired by a user. A trigger signal 44 that corresponds to the initial iming of the data pattern in data signal 42 is provided as an output from pattern generator 30 to the input of AWG 36. Referring still to the example of FIG. 4, the output of AWG 36 is then the DDJ modulation signal 46, which effectively corresponds to a periodic signal having a frequency that is matched in a substantially exact fashion to the frequency of the pattern repetition rate of data signal 42. DDJ modulation signal 46 may also contain some high frequency harmonics to ensure more realistic DDJ is injected. This is especially advantageous when testing receivers because of the receiver selective response to different jitter frequency components. A resulting data signal with DDJ, such as would be output on signal line 39 of pattern generator 30 is represented by the dashed line 48 in FIG. 4.

In the manner described above with respect to FIGS. 3 and 4, a periodic jitter is effectively generated that is static relative to the data pattern, which emulates the behavior of DDJ. A common 10 MHz external reference clock 40 is used to ensure that the sampling clock of the AWG 36 is locked to the bit clock generator 26. It is also essential to ensure phase consistency of the pattern relative to the AWG output to ensure that edge shift for each pattern edge is consistent from one repetition of the test to the next. Without such consistency, the AWG phase could be random relative to a specific edge of the pattern when the test starts, which will result in different DDJ readings for each repetition of the test. The phase consistency requirement may be met through a combination of software and hardware trigger capabilities present in the Tektronix 610 AWG or other comparable AWGs. This includes using the pattern trigger signal of the pattern generator 30 to trigger the AWG output. Once the test is completed, software disables the output. Upon reception of a start command from a central test program, the software enables the output, but the output will not start until the pattern edge trigger arrives. This setup provides a flexible DDJ injection method, where DDJ amplitude and shape (location of DDJ lines in a jitter histogram) can be programmed through the AWG.

To characterize transmitters and/or verify the jitter injection methodology such as that described above with respect to FIGS. 3 and 4 for receiver testing, jitter has to be decomposed to its subcomponents. A number of different methodologies have been proposed for jitter measurement, including using real-time (RT-) and equivalent-time (ET-) digital sampling oscilloscopes (DSO), bit error rate testers, and time interval analyzers. Jitter measurement with an oscilloscope typically takes several tens of second to minutes because many voltage samples must be taken to extract edge displacement information with sufficient accuracy, leading to long acquisition time in the case of the ET-DSO, or excessive processing time in the case of the RT-DSO. Time interval analyzers (TIAs), on the other hand, provide the ability to optimize the sampling process by directly sampling edge timing, which results in much faster measurements. Traditional TIAs are based on single-shot time interval measurement, in which each time interval is measured as the difference between a start and stop event. Such TIAs require a pattern marker/trigger signal for fast jitter decomposition. In accordance with the present subject matter, modified TIAs referred to as continuous time interval analyzers (CTIAs) may be utilized to obtain jitter measurements. With CTIAs, all the edge timings are measured relative to a common reference. A CTIA equipped with flexible and programmable arming modes allows implementation of fast and more flexible jitter measurement methodologies without the need for any hardware generated arming/trigger signal. This eliminates the need for a hardware clock recovery circuit, whose jitter can impact measurement results. Instead, a flexible event control mechanism provides an embedded or virtual marker capability that allows focused measurement of specific edges within a data stream. The CTIA's fast measurement capability without any marker signal makes it a great candidate for production testing of multi-Gbps ICs.

Figure 5:
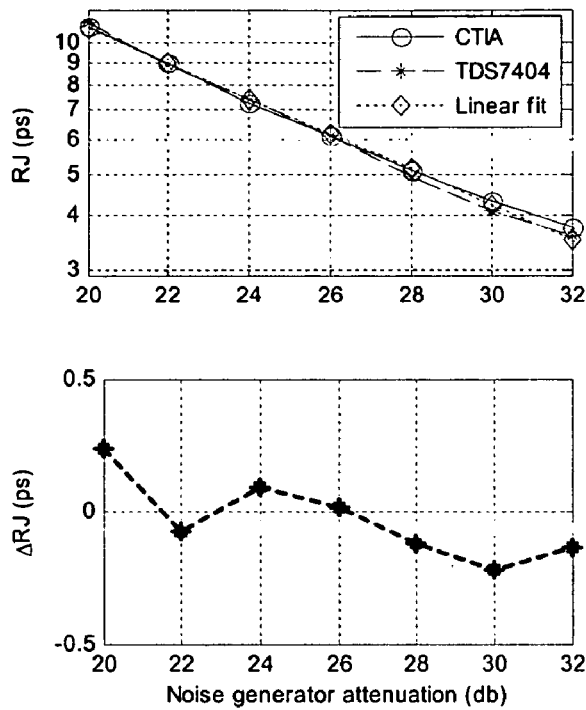
FIG. 5 provides respective graphical representations of RMS random jitter measurements on a logarithmic scale versus the noise generator attenuation in decibels taken using different time measurement devices in accordance with the present invention.

In a particular exemplary verification setup for validating the jitter injection system and methodology described above with respect to FIGS. 3 and 4, RJ, DDJ and PJ were injected into a serial data stream having an exemplary bit rate of 2.5 Gbps and employing a K28.5 repeating data pattern and jitter measurement was subsequently obtained. In such embodiment, jitter measurements were obtained using a real time digital sampling oscilloscope (RT-DSO), an equivalent time digital sampling oscilloscope (ET-DSO), and time interval analyzer such as the Femto 3200 brand CTIA. FIG. 5 shows the RMS RJ measured using the TDS7404 brand RT-DSO such as offered for sale by Tektronix and the GT4000 brand CTIA as offered for sale by Guide Technology Inc. The vertical axis is in logarithmic scale because the noise generator attenuation is selected in db. Both exemplary measurement instruments show that the injected RJ scales with the Gaussian noise level, resulting in an expected linear relationship between the noise generator attenuation and the injected RJ.

Figure 6:
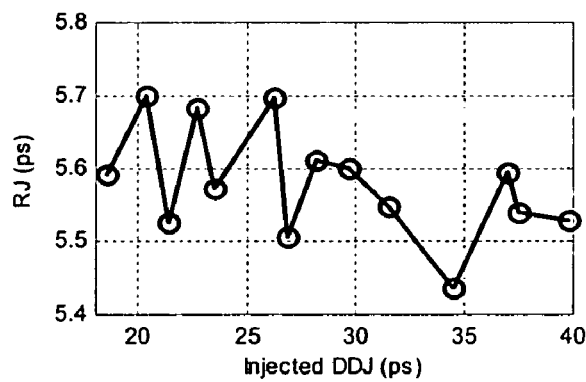
FIG. 6 provides a graphical representation of random jitter (RJ) levels versus data-dependent jitter (DDJ) levels for a specific exemplary test setup in accordance with the present invention, specifically exemplifying the RJ insensitivity to DDJ.
Figure 7:
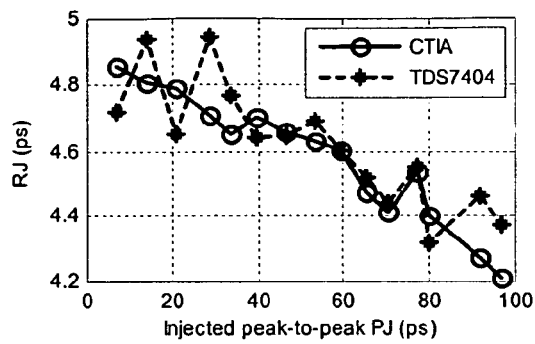
FIG. 7 provides a graphical representation of random jitter (RJ) levels versus injected peak-to-peak periodic jitter (PJ) levels for a specific exemplary test setup in accordance with the present invention.

Referring now to FIG. 6, a graphical representation of random jitter (RJ) levels versus data-dependent jitter (DDJ) levels for a data signal having a K28.5 repeating data pattern, a bit rate of 2.5 Gbps, and a noise generator attenuation of 27 dB are depicted. FIG. 6 illustrates that the RJ measurement is not sensitive to different DDJ values injected and the variations in FIG. 6 are within the statistical variations of the measurement. FIG. 7, which illustrates random jitter (RJ) levels versus injected peak-to-peak periodic jitter (PJ) levels for an exemplary data signal utilizing a K28.5 repeating data pattern and a bit rate of 2.5 Gbps, shows that the RJ measurements vary slightly as PJ is injected into the data stream. This is mainly due to the slight non-linearity of the Agilent 81133 delay line modulation, which reduces the noise power when the total variation becomes significant relative to the 250 ps delay line modulation limit. RJ test times less than 50 ms are achievable because of the CTIA optimized sampling and processing capability.

Figure 8:
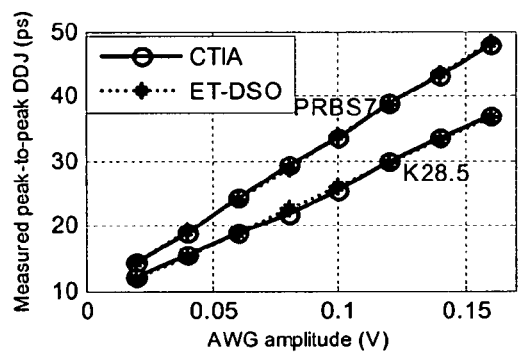
FIG. 8 provides a graphical representation of measured data-dependent jitter (DDJ) versus the voltage amplitude of an arbitrary waveform generator (AWG) for a specific exemplary test setup in accordance with the present invention.
Figure 9:
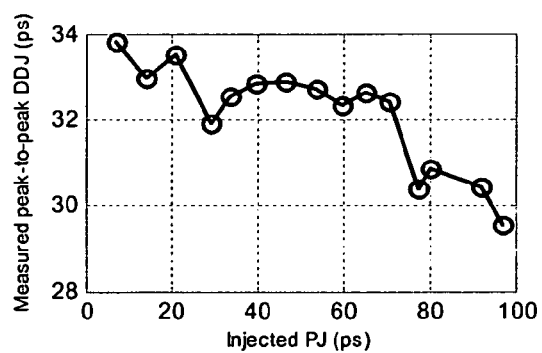
FIG. 9 provides a graphical representation of measured data-dependent jitter (DDJ) versus injected levels of periodic jitter (PJ) for a specific exemplary test setup in accordance with the present invention.

DDJ is measured in the exemplary results of FIGS. 8 and 9 with the CSA11801C brand ET-DSO from Tektronix using the 20 GHz sampling heads to reduce the oscilloscope impact on the DDJ. The DDJ measurements for a 2.5 Gbps data signal versus AWG amplitude in FIG. 8 show that the DDJ increases proportionally with the amplitude of the AWG output, which validates the DDJ injection method. The DDJ is also measured with the GuideTech Femto 3200 CTIA using internal calibration to remove the effects of CTIA bandwidth limitation. CTIA measurements substantially match that of an ET-DSO, and generally provide much faster measurements. For a typical PRBS7 pattern with 64 edges, the CTIA can estimate the DDJ in less than 100 ms, while the ET-DSO takes several minutes for the same number of edge samples. FIG. 9 illustrates that the CTIA-measured DDJ variations for different amounts of PJ in a K28.5 pattern 2.5 Gbps data signal is within expected statistical fluctuations, except for a slight decrease in the DDJ for large values of the PJ, which is due to the non-linearity of the delay line modulator used in the exemplary test setup of FIG. 3. In addition, the DDJ measurement repeatability is within +/−1 ps, which is sufficient for many testing applications. The total RJ and DDJ measurement time with oscilloscopes is in the range of a few seconds (2 s to 20 s), whereas a CTIA can complete the same measurement in 200 ms to 500 ms.

The results presented in the graphical illustrations of FIGS. 5-9, respectively, clearly show the effectiveness of the proposed jitter generation method to inject RJ, PJ, and especially DDJ in a controlled and independent fashion. The jitter measurement results also demonstrate ability of the CTIA to measure the RJ and DDJ very accurately in less than a few hundred milliseconds, which is at least an order of magnitude faster than oscilloscopes measurements.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

What is claimed is:

1. A system for generating a test signal with controllable amounts of signal jitter, comprising:
   a first signal generator configured to generate a data signal characterized by a given data pattern having a preselected bit rate and pattern length and that is periodically repeated at a first frequency and to generate a trigger signal that has a known relationship to the data pattern;

a second signal generator configured to receive the trigger signal from said first signal generator and to generate a modulation signal having a repetition frequency that is substantially equal to the bit rate of the data signal generated by said first signal generator divided by the pattern length of the data signal; and a third signal generator configured to receive the modulation signal from said second signal generator and to generate a clock signal that is phase modulated based on the modulation signal, wherein the clock signal is then provided as an input to said first signal generator to adjust the timing of the generated data signal.

2. The system of claim 1, further comprising a reference clock generator coupled to said second and third signal generators.

3. The system of claim 1, wherein said first signal generator comprises a pattern generator that is programmable by a user for specifying one or more of a variety of possible data patterns and bit rates.

4. The system of claim 1, wherein said second signal generator comprises a programmable arbitrary waveform generator.

5. The system of claim 1, wherein said third signal generator comprises a pulse generator characterized by a phase modulation input for receiving the modulation signal from said second signal generator.

6. The system of claim 5, wherein the phase modulation input of said pulse generator comprises a controllable delay line.

7. The system of claim 5, further comprising a clock generator coupled to said pulse generator and providing a reference clock signal thereto, wherein the clock signal generated by said pulse generator corresponds to a phase-modulated version of the reference clock signal modulated based on the modulation signal from said second signal generator.

8. The system of claim 1, further comprising:
a fourth signal generator configured to generate a random signal; and
a combiner for receiving the modulation signal from said second signal generator and the random signal from said fourth signal generator and to combine the random signal with the modulation signal before providing such signal to said third signal generator.

9. The system of claim 8, wherein said fourth signal generator comprises a Gaussian noise generator.

10. The system of claim 8, further comprising a fifth signal generator for generating a periodic signal that is also coupled to an input of said combiner such that both the periodic signal and the random signal are combined with the modulation signal before providing such signal to said third signal generator.

11. A method of providing a test signal with controllable amounts of signal jitter at an output of a test signal generator, said method comprising the steps of:
establishing a data pattern, bit rate and pattern length for a data signal;
generating a modulation signal having a repetition frequency that is substantially equal to the bit rate divided by the pattern length from said establishing step;
modulating the phase of a clock signal by the modulation signal from said generating step; and
generating and providing a test signal with the data pattern and pattern length from said establishing step and with a bit rate defined by the modulated clock signal from said modulating step.

12. The method of claim 11, further comprising a step of providing a trigger signal representative of selected data signal characteristics from said establishing step to a signal generator that subsequently effects said modulating step.

13. The method of claim 11, further comprising a step of ensuring the phase consistency of the generated modulation signal and the generated data signal.

14. The method of claim 11, wherein said step of modulating a clock signal further comprises:
generating a reference, clock signal;
providing the reference clock signal and the modulation signal to a controllable pulse generator; and
generating a modulated clock signal with a bit rate based on that of the reference clock signal and delayed by representative information in the modulation signal.

15. The method of claim 11, further comprising a step of generating a random signal and combining the random signal with the generated modulation signal.

16. The method of claim 15, wherein said step of modulating the phase of a clock signal comprises modulating the phase of a clock signal by the random signal and the modulation signal.

17. The method of claim 15, further comprising a step of generating a periodic signal and combining the periodic signal with the random signal and the modulation signal.

18. The method of claim 17, wherein said step of modulating the phase of a clock signal comprises modulating the phase of a clock signal by the periodic signal and the random signal and the modulation signal.

* * * * *